United States Patent
Romero

(10) Patent No.: US 12,253,576 B2
(45) Date of Patent: Mar. 18, 2025

(54) SELF-CALIBRATING MAGNETORESISTANCE-BASED MAGNETIC FIELD SENSORS

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 150 days.

(21) Appl. No.: 18/152,189

(22) Filed: Jan. 10, 2023

(65) Prior Publication Data

US 2024/0230791 A1 Jul. 11, 2024

(51) Int. Cl.
*G01R 33/00* (2006.01)
*G01R 33/09* (2006.01)

(52) U.S. Cl.
CPC ........ *G01R 33/0011* (2013.01); *G01R 33/093* (2013.01); *G01R 33/096* (2013.01); *G01R 33/098* (2013.01)

(58) Field of Classification Search
CPC ............ G01R 33/0011; G01R 33/0017; G01R 33/0035; G01R 33/0041; G01R 33/09; G01R 33/093; G01R 33/096; G01R 33/098

See application file for complete search history.

(56) References Cited

U.S. PATENT DOCUMENTS

| | | | | |
|---|---|---|---|---|
| 4,590,583 | A * | 5/1986 | Miller | H04M 3/30 708/312 |
| 4,860,317 | A * | 8/1989 | Tomlinson | H04N 21/4382 455/12.1 |
| 7,746,065 | B2 | 6/2010 | Pastre et al. | |
| 7,923,996 | B2 | 4/2011 | Doogue et al. | |
| 8,030,918 | B2 | 10/2011 | Doogue et al. | |
| 8,447,556 | B2 | 5/2013 | Friedrich et al. | |

(Continued)

FOREIGN PATENT DOCUMENTS

CN 107305241 10/2017

OTHER PUBLICATIONS

U.S. Non-Final Office Action dated Jul. 3, 2014, for U.S. Appl. No. 13/398,127; 31 pages.

(Continued)

*Primary Examiner* — Vinh P Nguyen
(74) *Attorney, Agent, or Firm* — DALY, CROWLEY, MOFFORD & DURKEE, LLP

(57) ABSTRACT

Systems, circuits, and methods provide self-calibration for magnetoresistance-based magnetic field sensors. Examples can include use of a closed loop acting as a feedback or calibration loop that is configured to process a reference signal applied to one or more magnetoresistance elements in a MR-based magnetic field sensor that also detects one or more external magnetic fields. The closed loop can adjust a bias voltage applied to the one or more magnetoresistance elements based on the reference signal. The calibration loop can accordingly provide for automatic or self-calibration of sensitivity of one or more magnetoresistance elements of the sensors to compensate for external factors affecting sensitivity of the one or more magnetoresistance elements.

51 Claims, 9 Drawing Sheets

(56) References Cited

U.S. PATENT DOCUMENTS

| | | | |
|---|---|---|---|
| 8,542,010 B2 | 9/2013 | Cesaretti et al. | |
| 8,680,846 B2 | 3/2014 | Cesaretti et al. | |
| 8,907,669 B2 | 12/2014 | Petrie | |
| 9,201,122 B2 | 12/2015 | Cesaretti et al. | |
| 9,404,991 B2* | 8/2016 | Anelli | G01R 33/0017 |
| 9,645,220 B2 | 5/2017 | Cesaretti et al. | |
| 9,804,222 B2 | 10/2017 | Petrie et al. | |
| 9,841,485 B2 | 12/2017 | Petrie et al. | |
| 10,132,879 B2* | 11/2018 | Latham | G01R 33/077 |
| 10,574,258 B1* | 2/2020 | Albel | H02M 7/53871 |
| 10,908,232 B2 | 2/2021 | Latham et al. | |
| 11,467,235 B1* | 10/2022 | Romero | G01D 5/147 |
| 11,555,872 B2 | 1/2023 | Romero | |
| 11,927,650 B2* | 3/2024 | Romero | G01R 33/091 |
| 2007/0247141 A1 | 10/2007 | Pastre et al. | |
| 2013/0093412 A1 | 4/2013 | Anelli et al. | |
| 2013/0214774 A1 | 8/2013 | Cesaretti et al. | |
| 2017/0067980 A1 | 3/2017 | Thiagarajan et al. | |
| 2017/0336481 A1 | 11/2017 | Latham et al. | |
| 2020/0393529 A1 | 12/2020 | Larson et al. | |
| 2022/0236347 A1 | 7/2022 | Romero | |

OTHER PUBLICATIONS

Response to Non-Final U.S. Office Action dated Jul. 3, 2014, for U.S. Appl. No. 13/398,127; Response filed on Jul. 31, 2014; 17 pages.
U.S. Non-Final Office Action dated Nov. 24, 2014, for U.S. Appl. No. 13/398,127; 48 pages.
Response to Non-Final U.S. Office Action dated Nov. 24, 2014, for U.S. Appl. No. 13/398,127; Response filed on Mar. 20, 2015; 28 pages.
U.S. Notice of Allowance dated Jul. 28, 2015, for U.S. Appl. No. 13/398,127; 9 pages.
Supplemental U.S. Notice of Allowance dated Aug. 21, 2015, for U.S. Appl. No. 13/398,127; 2 pages.
Supplemental U.S. Notice of Allowance dated Oct. 6, 2015, for U.S. Appl. No. 13/398,127; 2 pages.
U.S. Appl. No. 18/458,509, filed Aug. 30, 2023, Romero.
International Search Report and Written Opinion dated Mar. 19, 2024, for International Application No. PCT/US2023/081504; 14 pages.
U.S. Restriction Requirement dated May 14, 2010 for U.S. Appl. No. 12/037,393; 6 pages.
Response to Restriction Requirement dated May 14, 2010 for U.S. Appl. No. 12/037,393, filed Jun. 2, 2010; 1 page.
U.S. Office Action dated Jun. 30, 2010 for U.S. Appl. No. 12/037,393; 11 pages.
Response to U.S. Office Action dated Jun. 30, 2010 for U.S. Appl. No. 12/037,393; Response filed on Oct. 14, 2010; 35 pages.
U.S. Notice of Allowance dated Nov. 3, 2010 for U.S. Appl. No. 12/037,393; 4 pages.
U.S. Office Action dated Feb. 2, 2011 for U.S. Appl. No. 12/959,672; 8 pages.
Response to U.S. Office Action dated Feb. 2, 2011 for U.S. Appl. No. 12/959,672; Response filed on May 24, 2011; 8 pages.
U.S. Notice of Allowance dated Jun. 27, 2011 for U.S. Appl. No. 12/959,672; 7 pages.
U.S. Notice of Allowance dated Jul. 19, 2011 for U.S. Appl. No. 12/959,672; 7 pages.
U.S. Office Action dated Mar. 27, 2015 for U.S. Appl. No. 13/864,515; 12 pages.
Response to U.S. Office Action dated Mar. 27, 2015 for U.S. Appl. No. 13/864,515; Response filed on Jul. 24, 2015; 13 pages.
U.S. Office Action dated Nov. 4, 2015 for U.S. Appl. No. 13/864,515; 20 pages.
Response to U.S. Office Action dated Nov. 4, 2015 for U.S. Appl. No. 13/864,515; Response filed on Feb. 3, 2016; 11 pages.
U.S. Notice of Allowance dated Mar. 8, 2016 for U.S. Appl. No. 13/864,515; 12 pages.
U.S. Office Action dated Jun. 5, 2014 for U.S. Appl. No. 13/556,663; 7 pages.
Response to U.S. Office Action dated Jun. 5, 2014 for U.S. Appl. No. 13/556,663; Response filed on Jul. 29, 2014; 11 pages.
U.S. Notice of Allowance dated Aug. 13, 2014 for U.S. Appl. No. 13/556,663; 5 pages.
Search Reporting and Written Opinion dated Oct. 17, 2024; for PCT Application No. PCT/US2024/037167; 15 pages.

* cited by examiner

SELF-CALIBRATING MAGNETORESISTANCE-BASED MAGNETIC FIELD SENSORS

BACKGROUND

Magnetic field sensors utilize magnetic field sensing elements to detect one or more magnetic fields for various purposes. For example, magnetic field sensors are often used to detect a current flowing in a conductor. Magnetic field sensors may also be used to detect a ferromagnetic or conductive target and may generally act to detect motion or position of the target. Such sensors are found in many technology areas including robotics, automotive, manufacturing and so forth. For example, a magnetic field sensor may be used to detect when a vehicle wheel locks up (stops rotating), triggering the vehicle's control processor to engage an anti-lock braking system. Magnetic field sensors may also detect distance to an object. As examples, magnetic field sensors may be used to detect the position of a hydraulic piston or angular position of a steering column.

Magnetoresistance elements are a class of magnetic sensing elements having a variable resistance that changes in response to changes in an applied or sensed magnetic field. There are different types of magnetoresistance elements, for example, semiconductor magnetoresistance elements such as ones including Indium Antimonide (InSb), anisotropic magnetoresistance (AMR) elements, giant magnetoresistance (GMR) elements, and tunneling magnetoresistance (TMR) elements, which are also referred to as magnetic tunnel junction (MTJ) elements. Some magnetoresistance elements, e.g., GMR and TMR elements, may have a relatively small or limited linear output range in which a change in sensed magnetic field intensity is linear with a corresponding change in the resistance of the elements. When used in magnetic closed-loop configurations, xMR based sensor may provide a relatively limited dynamic range, which may not be desirable for certain sensor applications.

SUMMARY

An aspect of the present disclosure includes a self-calibrating magnetic field sensor. The self-calibrating magnetic field sensor may include magnetoresistance (MR) circuitry configured to receive an external magnetic field in a first frequency band and a reference magnetic field in a second frequency band, where the magnetoresistance circuitry is configured to produce an MR output electrical signal including an external signal based on the external magnetic field and a reference signal based on the reference magnetic field. The sensor may include a coil driver circuit configured to produce the reference magnetic field and direct it to the magnetoresistance circuitry. The sensor may include a feedback loop configured to receive the MR output electrical signal from the magnetoresistance circuitry, where the feedback loop is configured to filter out the external signal and extract the reference signal, and where the feedback loop is further configured to adjust a sensitivity of the magnetoresistance circuitry based on the reference signal. The sensor may include main signal path configured to receive the MR output electrical signal and filter out the reference signal and extract the external signal, where the main signal path is configured to produce, based on the external signal, a main signal path output signal indicative of information encoded in the external magnetic field.

Implementations may include one or more of the following features. The magnetoresistance circuitry of the sensor may include a plurality of magnetoresistance elements configured in a bridge. The magnetoresistance circuitry may include one or more giant magnetoresistance (GMR) elements. The magnetoresistance circuitry may include one or more anisotropic magnetoresistance (AMR) elements. The sensor where the magnetoresistance circuitry may include one or more tunneling magnetoresistance (TMR) elements. The feedback loop may include a demodulator configured to demodulate the MR output signal at a modulation frequency of the reference magnetic field and produce a corresponding demodulated signal. The feedback loop may include a first sum unit configured to subtract a nominal reference voltage from the demodulated signal and produce a feedback error signal. The feedback loop further may include a gain correction unit configured to receive the feedback error signal and based on the feedback error signal adjust the sensitivity of the magnetoresistance circuitry. The feedback loop further may include a second sum unit configured to subtract the feedback error signal from a bias voltage supplied to an MR driver of the magnetoresistance circuitry. The gain correction unit may include a third amplifier. The feedback loop may include a first amplifier configured to provide a desired gain to the demodulated signal. The feedback loop may include an analog-to-digital converter configured to convert the demodulated signal to a digital signal. The feedback path further may include a digital integrator configured to receive the digital (reference) signal and output an integral of the digital signal over time. The feedback loop further may include a low-pass filter configured to receive the demodulated signal and remove residual signal components of the external signal. The low-pass filter may include a digital filter. The digital filter may include a cascaded integrator-comb (CIC) filter. The filter may include an analog filter. The analog filter may include a notch filter. The feedback path further may include an analog integrator configured to configured to receive the demodulated (reference) signal and output an integral of the demodulated signal over time. The main signal path output signal may include positional information about a target. The main signal path output signal may include information about a current in a conductor. Implementations of the described techniques may include hardware, a method or process, or computer software on a computer-accessible medium.

A further aspect of the present disclosure includes a method of automatically adjusting sensitivity of a magnetic field sensor. The method may include, for magnetoresistance (MR) circuitry configured to produce an MR output signal based on sensed magnetic field, detecting an external magnetic field in a first frequency band (e.g., base band) and providing a reference magnetic field in a second frequency band (e.g., a modulation frequency band). The method may further include providing a main signal path configured to receive the MR output signal and extract an external signal corresponding to the external magnetic field, where the main signal path is configured to produce, based on the external signal, a main signal path output signal indicative of information encoded in the external signal. The method may include providing a closed loop configured to extract from the MR output signal a reference signal corresponding to the reference magnetic field, where the closed loop is configured to adjust a sensitivity of the magnetoresistance circuitry based on the reference signal. The method may include using the closed loop, adjusting the sensitivity of the magnetoresistance circuity based on the reference signal. Embodiments of the aspect may include use of or may be used with corresponding computer systems, apparatus, and computer programs recorded on one or more computer storage devices, each configured to perform the actions of the methods.

Implementations may include one or more of the following features. Adjusting the sensitivity of the magnetoresistance circuitry may include adjusting a bias voltage applied to one or more magnetoresistance elements of the magnetoresistance circuitry. Adjusting the sensitivity of the magnetoresistance circuitry may include adjusting a gain setting of an amplifier in the closed loop. Adjusting the sensitivity of the magnetoresistance circuitry may include demodulating the MR output signal at a modulation frequency of the reference magnetic field. The method may include applying a low-pass filter to the demodulated MR output signal. Applying the low-pass filter to the demodulated MR output signal may include applying a digital CIC filter. Applying the low-pass filter to the demodulated MR output signal may include applying an analog filter. The main signal path output signal may be indicative of a position of a target. The main signal path output signal may be indicative of a current in a conductor. Adjusting the sensitivity of the magnetoresistance (MR) circuity may include compensating for any ambient or environment operating conditions affecting the MR sensitivity, such as temperature changes, presence of mechanical stresses, addition of stray magnetic fields, etc.; such conditions may even include non-linearities of the MR element(s) or transducer(s) themselves, e.g., a non-linear sensitivity change as an input signal swings through the transfer function curve of the MR transducer/element. The magnetoresistance circuitry may include one or more giant magnetoresistance (GMR) elements. The magnetoresistance circuitry may include one or more anisotropic magnetoresistance (AMR) elements. The magnetoresistance circuitry may include one or more tunneling magnetoresistance (TMR) elements. Implementations of the described techniques may include hardware, a method or process, or computer software on a computer-accessible medium.

Other embodiments of the aspects and examples described may include corresponding computer systems, apparatus, and computer programs recorded on one or more computer storage devices, each configured to perform the actions of the methods as described herein. A computer system of one or more computers can be configured to perform particular operations or actions, as described herein, by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which:

FIG. 5A shows a first configuration with the bridge MR elements sharing a common direction of sensitivity while FIG. 5B shows a second configuration with a pair or re-pinned MR elements having opposed directions of sensitivity.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, circuits, and methods providing self-calibration for magnetoresistance-based magnetic field sensors. Examples can include use of a closed loop acting as a feedback or calibration loop that is configured to process a reference signal applied to one or more magnetoresistance elements in a MR-based magnetic field sensor that also detects one or more external magnetic fields. The closed loop can adjust a bias voltage applied to the one or more magnetoresistance elements based on the reference signal. The calibration loop can accordingly provide for self-calibration (a.k.a., automatic compensation) of MR block (sensor or element) sensitivity (gain) to compensate for external factors affecting sensitivity of the one or more magnetoresistance elements. Aspects, examples, and embodiments of the present disclosure can accordingly provide for continuous calibration of sensitivity of an open-loop MR-based sensor by utilizing a closed-loop operating on a reference magnetic field signal, achieving high bandwidths (typically required for many current sensors applications) while also calibrating the sensor sensitivity in a continuous way. Aspects, examples, and embodiments of the present disclosure can accordingly provide an ability to compensate for sensitivity drifts caused by temperature, mechanical stresses, stray fields, or any other external factor, while providing suitable high bandwidth(s) for processing of signals on the open loop (main signal path).

Figure 1A:
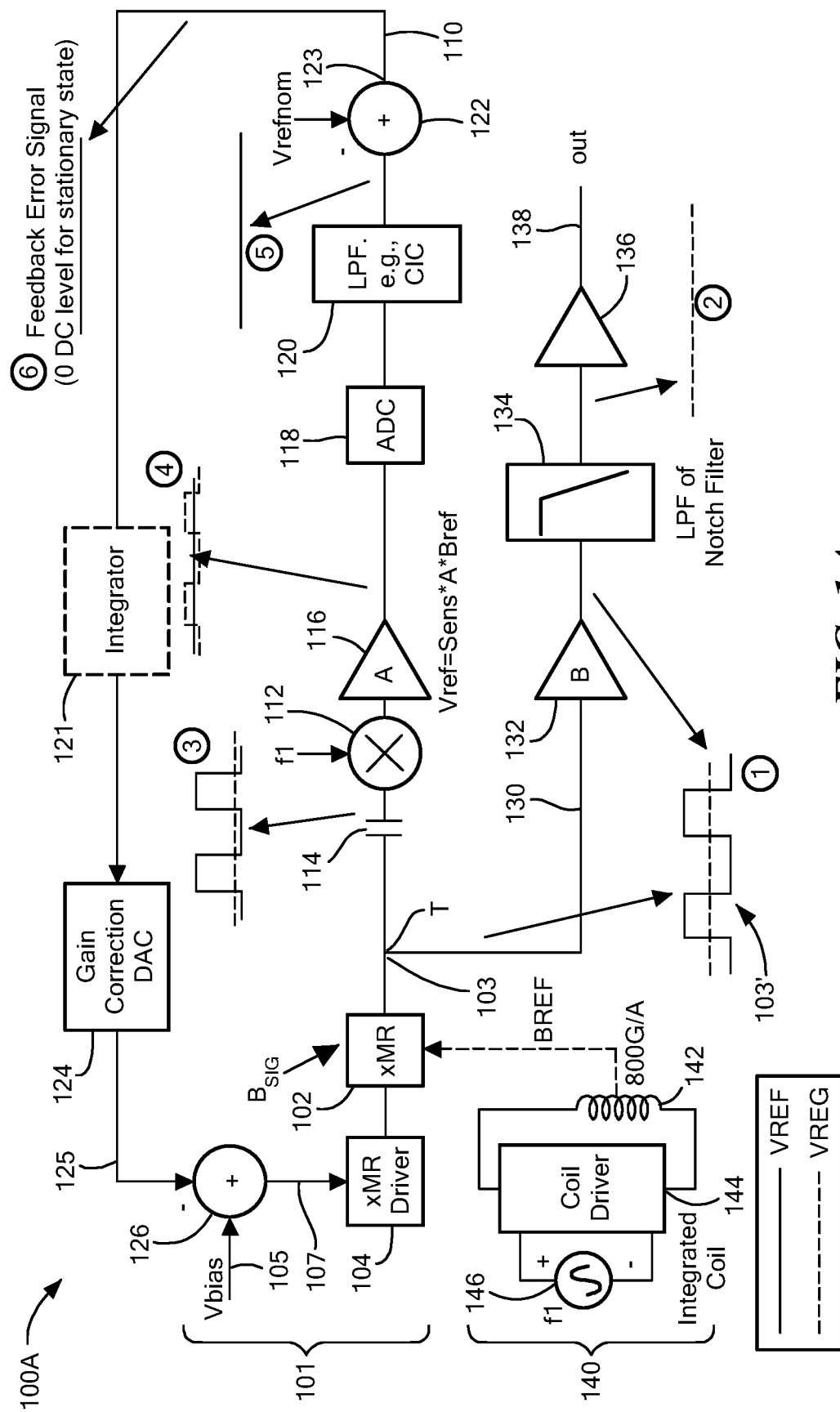
FIG. 1A is a diagram showing an example self-calibrating magnetic field sensor having digital components in a feedback loop, in accordance with the present disclosure.

FIG. 1A is a diagram showing an example self-calibrating magnetic field sensor 100A having digital components in a feedback loop, in accordance with the present disclosure. As shown, magnetic field sensor 100A may include a magnetoresistance (MR) section 101 having one or more MR elements, shown as "xMR" block 102, operative (configured) to sense one or more magnetic fields, including one or more external magnetic fields (indicated as $B_{SIG}$), and also a reference magnetic field produced by the sensor 100A itself. The xMR block 102 is configured to produce an output 103 with corresponding signal components. Magnetic field sensor 100A may also include a closed loop 110 configured as a feedback loop, a main signal path 130 configured to process signals derived from or corresponding to one or more external magnetic fields, and a reference magnetic field section 140 configured to supply a reference magnetic field to xMR block 102 for calibration using the closed loop 110. Main signal path 130 can produce an output based on a main signal (shown by $V_{SIG}$) which may be indicative of information encoded in the one or more external magnetic fields ($B_{SIG}$), e.g., information corresponding to a current in a conductor or position of a moveable target/object.

MR section 101 may include xMR transducer or block 102, which can sense (detect) one or more magnetic fields (sensed fields), which can be external and/or internal to the sensor 100A, and produce an output 103 having corresponding signal components. As used in the term "xMR," the "x" indicates that the MR elements may be of any suitable kind, e.g., anisotropic magnetoresistance (AMR) elements, giant magnetoresistance (GMR) elements, or tunneling magnetoresistance (TMR) elements. When multiple xMR elements are present for xMR block 102, they may be configured in a bridge, e.g., a half-bridge, or a full-bridge such as a Wheatstone bridge. The xMR driver 104 can supply drive voltage for the xMR element(s) of xMR block 102 which produce output signals indicative of any sensed (detected) magnetic field (indicated as $B_{SIG}$). As shown, the xMR block 102 can be connected to closed loop 110 and the main signal path 130.

Reference magnetic field section 140 is configured to generate and supply a reference magnetic field ($B_{REF}$) to xMR block 102. Reference magnetic field section 140 may include a coil 142, a coil driver 144, and a current source 146 configured to generate a current at a desired modulation frequency indicated by modulation frequency $f_1$. Coil 142 is shown with an example coil strength of 800 Gauss/amp; other values may of course be used within the scope of the present disclosure. Coil driver 144 is configured to receive the current and provide it to coil 142 to generate reference magnetic field $B_{REF}$ for detection by xMR 102 so that xMR 102 can consequently provide closed loop 110 with reference signal $V_{REF}$. Reference magnetic field 140 can be made independent of environmental conditions or variables, e.g., changes in temperature and/or mechanical stress(es). For reference magnetic field section 140, use of resistors with low thermal coefficient (TC) and/or high insensitivity to mechanical stresses, e.g., highly doped poly resistors, can facilitate generation of the reference magnetic field independent of external factors affecting sensitivity of xMR block 102, e.g., changes in temperature, application of stray magnetic fields, introduction of mechanical stresses, etc.

As noted previously, the output signal(s) 103 produced by xMR block 102 can include a main signal component (indicated as $V_{SIG}$) corresponding to one or more external magnetic fields (indicated as $B_{SIG}$) and also a reference signal component (indicated as $V_{REF}$) corresponding to the reference magnetic field $B_{REF}$ generated by reference magnetic field section 140. An example of main signal and reference signal components 103' of output 103 are shown at location 1 (circled) at output of xMR block 102 and adjacent to a fork in the signal path, identified at a tap point (T), with branches leading to closed loop 110 and main signal path 130. As described in further detail below, closed loop 110 can operate to automatically calibrate or adjust the sensitivity of xMR block 102 as operational conditions affecting sensitivity of xMR block 102 are altered, e.g., changes in ambient temperature, introduction of mechanical strain, introduction of stray magnetic field(s), etc. In addition, the closed (feedback) loop 110 can operate to automatically calibrate or adjust the sensitivity of xMR block 102 to compensate for non-linearities inherent to the included xMR transducer or xMR element(s).

Closed loop 110 may include a blocking capacitor 114 to facilitate blocking of low frequency content of the external field signal $V_{SIG}$ while letting the reference signal $V_{REF}$ go through, as indicated at location 3 (circled). Closed loop 110 may include a demodulator 112 configured to receive output signals 103 from the xMR block 102 and demodulate the signals by a demodulation frequency, e.g., shown as $f_1$. Demodulator 112 can accordingly operate to demodulate the reference frequency V down to base band and at the same time place the main signal $V_{SIG}$, or an attenuated version of the main signal $V_{SIG}$ (after having gone through the blocking capacitor), at the modulation frequency, as indicated at location 4 (circled).

Closed loop 110 can include amplifier 116 which have a desired gain (A), as shown. Closed loop 110 can also include an analog-to-digital converter (ADC) 118 and a digital filter 120, e.g., as indicated by cascaded-integrator comb (CIC) filter shown. Closed loop 110 may include a summation unit 122, which can be used to subtract a nominal reference (voltage) signal (e.g., shown as $V_{REFNOM}$) to adjust the reference signal at that point in the closed loop 110 for producing a feedback (error) signal 125. The nominal reference voltage ($V_{REFNOM}$) can represent the voltage that is expected to be generated by the reference (internal) field having gone through the XMR bridge. For a desired targeted sensitivity level, a certain output voltage coming from the bridge would be expected, which after being amplified by A, would be equal to $V_{REFNOM}$. If the actual voltage from the bridge (xMR block 102) deviates from this "ideal" value, the closed loop 110 will correct such error. Such $V_{REFNOM}$ voltage can be, for example, a scaled copy or version of the voltage used for generating the current that is used to drive the integrated coil for generating the reference field.

The feedback error signal 125 can be used to adjust a bias voltage 105 producing an adjusted bias voltage 107, which is supplied to xMR driver 104. The signal adjustment on closed loop 110 is indicated as the change between signals shown at location 5 (circled) and 6 (circled), i.e., before and after summation unit 122. The nominal reference voltage ($V_{REFNOM}$) may be set or adjusted as desired, e.g., in response to an external or internal operational condition or to meet a desired target or range of operation, etc. The summation unit 122 can provide the resulting signal 123 as a feedback error signal to digital-to-analog converter (DAC) 124, which may include gain adjustment/correction functionality.

Closed loop 110 may include an optional integrator 121, as shown. Integrator 121 is not mandatory but may be advantageous since it can provide or facilitate higher loop gain and better stability conditions for the loop 110. Such an integrator 121 may be used for digital and/or analog examples/applications. The signal produced by DAC 124 can be supplied to summation unit 126, which can be configured to subtract the feedback error 125 signal from an initial bias signal 105 and supply the resulting adjusted bias signal 107 to the xMR driver 104 for driving and adjusting the sensitivity of xMR block 102.

Main signal path 130 may include amplifier 132, with indicated gain (B), and filter 134, e.g., a low-pass filter (LPF) or notch filter, configured to filter out (block) the reference signal component ($V_{REF}$) to extract the main signal $V_{SIG}$ from the output of xMR block 102, as indicated at location 2 (circled) where $V_{REF}$ is absent. Main signal path 130 may optionally include one or more additional components, e.g., shown by amplifier 136, for additional processing and/or signal conditioning of main signal $V_{SIG}$. Main signal path 130 can then produce one or more output signals 138 that are based on main signal $V_{REF}$ which may be indicative of information encoded in the sensed magnetic field ($B_{SIG}$), e.g., corresponding to a current in a conductor or position of a moveable target/object.

In operation of magnetic field sensor 100A, closed loop (feedback loop) 110 receives and amplifies the reference field signal, while filtering out the lower frequency external field signal. Blocking capacitor 114 in loop 110 can facilitate blocking the low frequency content of the external field signal, while letting the reference signal $V_{REF}$ go through, possibly with some residual level (residue) of the external magnetic field signal (as shown at location 3). The reference signal $V_{REF}$ and the residue of the external magnetic field signal can be demodulated at the frequency of the reference signal (f1). Consequently, the reference signal $V_{REF}$ is brought back to base band while the residue of the external field signal $V_{SIG}$ shifted to higher frequencies (as shown at location 3). These two signals can be amplified by amplifier 116 (with gain A) and subsequently digitized by ADC 118, e.g., a sigma-delta (SD) converter, producing an output including a digital version of the reference signal $V_{REF}$. Digital lowpass filter (LPF) 120 can provide further low-pass filtering, facilitating full elimination of residues of the external field signal. The output of the digital LPF 120 may then be purely a recovered reference signal $V_{REF}$, as indicated at location 5 (circled). In examples where ADC 118 includes a sigma-delta (SD) converter, LPF 120 may include a cascaded integrator-comb (CIC) filter, as shown.

Summation unit 122 can subtract a nominal reference signal (e.g., shown as $V_{REFNOM}$), which can be preset or adjusted, from the recovered reference signal $V_{SIG}$. The difference between these two signals constitutes a feedback error signal, as indicated at position 6 (circled), which can then be fed into gain correction DAC 124. When no changes have occurred over a sufficiently long time span (e.g., 2-3 time constants of the circuit, 2-3 seconds, etc.), the error feedback signal may be at or close to zero (DC), as shown. Changes in external conditions can produce corresponding changes in the error feedback signal that is based on $V_{SIG}$. DAC 124 can add or subtract an error voltage (or current) on top of the nominal value of the error feedback signal, e.g., at location 6 (which can also correspond to the nominal reference signal $V_{REFNOM}$). Once loop 110 is engaged (operating), any change on the sensitivity of the MR element transducer 102 due to temperature, mechanical stresses, aging, stray field, etc. will be compensated for by the feedback loop 110 by properly adjusting the MR bias voltage or current at xMR driver 104. The sensitivity provided by the xMR block 102 (e.g., in Volts/Gauss sensitivity) may accordingly be essentially independent of external factors otherwise affecting sensitivity of the xMR element(s) of xMR block 102.

The main signal path (channel) 130 then can receive the xMR block output signal 103, filter out the reference signal component, which is at the selected modulation frequency (e.g., $f_1$), and process the main signal component $V_{SIG}$, e.g., to determine information encoded in the sensed magnetic field ($B_{SIG}$). Such information can correspond to, e.g., a current in a conductor or position of a moveable target/object, etc. The main signal component processed by main signal path 130 may accordingly be essentially independent of externally-induced changes or effects on the sensitivity of the MR element(s), e.g., temperature, stray field, mechanical stresses etc., as well as any non-linearities inherent to the xMR elements/transducer.

Figure 1B:
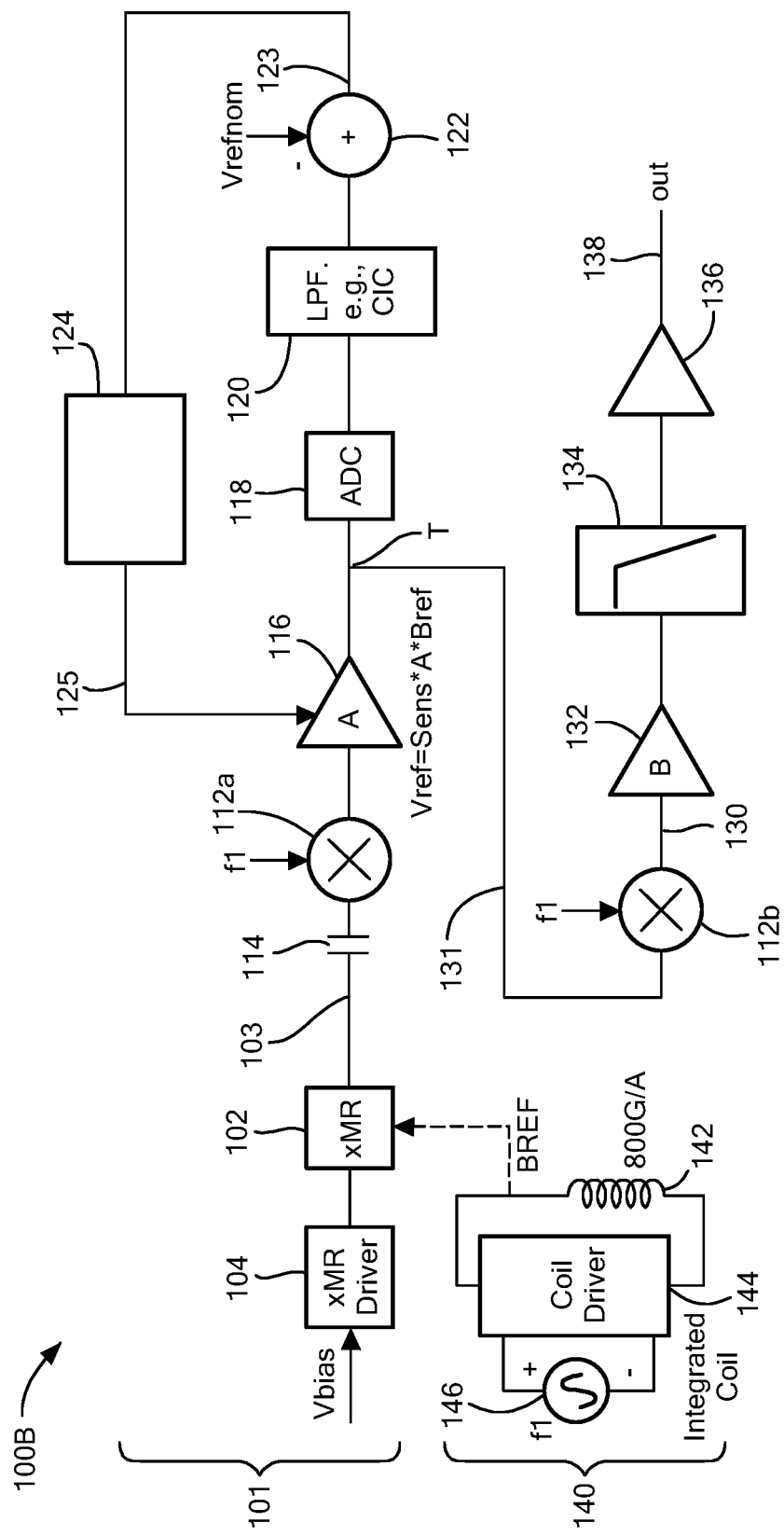
FIG. 1B is a diagram showing an example self-calibrating magnetic field sensor similar to the magnetic field sensor of FIG. 1A but with a different configuration for the feedback loop, in accordance with the present disclosure.

FIG. 1B is a diagram showing an example self-calibrating magnetic field sensor 100B similar to the magnetic field sensor 100A of FIG. 1A but with a different configuration for feedback loop 110, in accordance with the present disclosure. In FIG. 1B like reference numbers are used to indicate features/components shared with magnetic field sensor 100A. As shown, magnetic field sensor 100B can include an xMR block 101, closed loop 110 configured as a feedback loop to xMR block 101, main signal channel 130, and reference magnetic field section 140. Blocking capacitor 114 may be omitted in some examples.

Figure 2A:
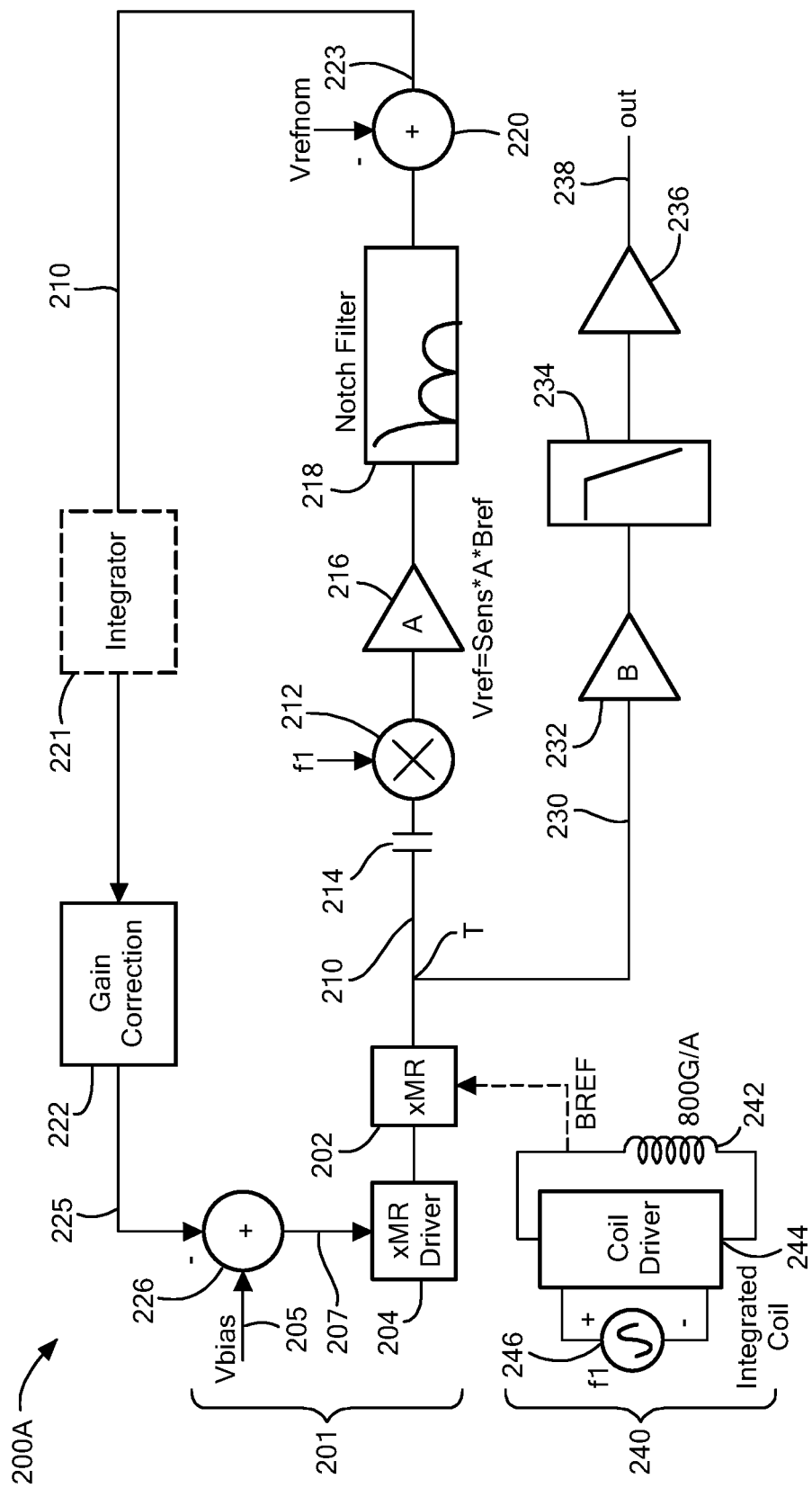
FIG. 2A is a diagram showing an example self-calibrating magnetic field sensor having analog components in a feedback loop, in accordance with the present disclosure.
Figure 2B:
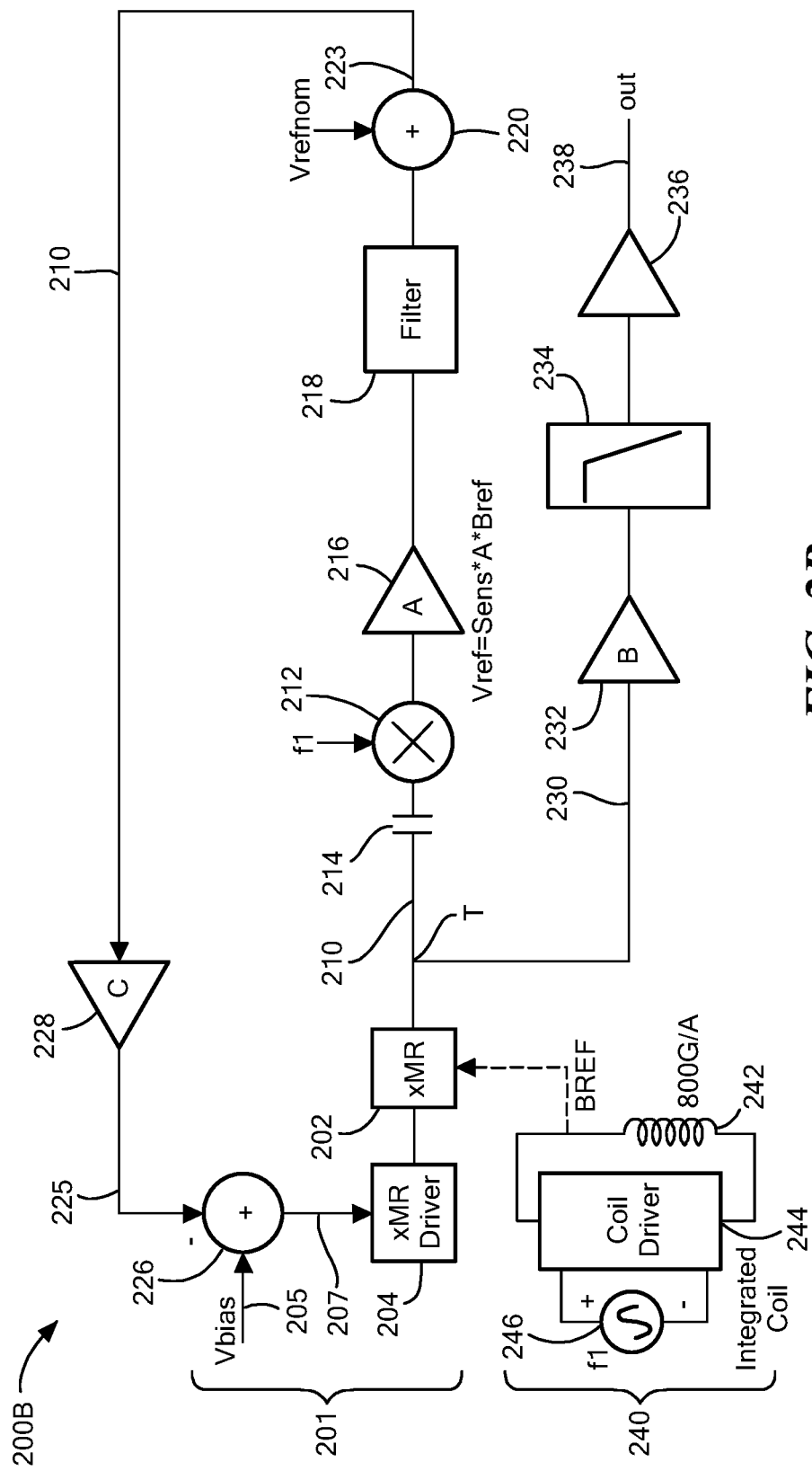
FIG. 2B is a diagram showing an example self-calibrating magnetic field sensor similar to the magnetic field sensor of FIG. 2A but with a different configuration for the feedback loop, in accordance with the present disclosure.

For sensor 100B, closed (feedback) loop 110 is configured to provide a feedback signal to amplifier 116 of the feedback loop (instead of xMR driver 104). Changes in sensitivity of xMR block 102 accordingly are used to adjust the gain (A) of amplifier 116. In some examples, main signal path 130 may include (second) demodulator 112b receiving signals from loop 110 at a tap point (T) located after amplifier 116. Signals on main signal channel or path 130 can accordingly be provided from a location (e.g., tap point T) on loop 110 by connection 131, undergo demodulation by demodulator 112b (reversing modulation applied by modulator 112a) to return the signals to base band, and then undergo further processing. Main signal path 130 can produce one or more output signals 138 that are based on main signal V and which may be indicative of information encoded in the sensed magnetic field ($B_{SIG}$), e.g., corresponding to a current in a conductor or position of a moveable target/object Alternative examples and/or embodiments may include analog components in addition to or substitution for digital components; FIGS. 2A-2B show two examples.

FIG. 2A is a diagram showing an example self-calibrating magnetic field sensor 200A having analog components in a feedback loop, in accordance with the present disclosure. Magnetic field sensor 200A may be generally similar to magnetic field sensor 100A of FIG. 1A but with some analog components substituting for digital ones. As shown, magnetic field sensor 200A may include an xMR section 201, a feedback loop 210, a main signal path 230, and a reference magnetic field section 240.

MR section 201 may include xMR transducer or block 202, which can sense (detect) one or more magnetic fields (sensed fields), which can be external and/or internal to the sensor 200A, and produce an output 203 having corresponding signal components. Sensor 200A can include xMR driver 204, which may be configured to supply drive voltage for the xMR element(s) of xMR block 202. As shown, the xMR block 202 can be connected to closed loop 210 and the main signal path 230.

Reference magnetic field section 240 is configured to generate and supply a reference magnetic field ($B_{REF}$) to xMR block 202. Reference magnetic field section 240 may include a coil 242, a coil driver 244, and a current source 246 configured to generate a current at a desired modulation frequency indicated by modulation frequency $f_1$. Coil driver 244 may be configured to receive the current and provide it to coil 242 to generate reference magnetic field $B_{REF}$ for detection by xMR 202 so that xMR 202 can consequently provide closed loop 210 with reference signal $V_{REF}$.

Closed loop 210 can operates to automatically calibrate or adjust the sensitivity of xMR block 202 (e.g., by adjusting bias voltage supplied to xMR driver 204) as operational conditions affecting sensitivity of xMR block 202 are altered, e.g., changes in ambient temperature, introduction of mechanical strain, introduction of stray magnetic field(s), etc.

Closed loop 210 may include a blocking capacitor 214 to facilitate blocking the low frequency content of the external field signal, while letting the reference signal go through. Closed loop 210 may include a demodulator 212 configured to receive output signals 203 from the xMR element(s) of xMR block 202 and demodulate the output signals 203 by a demodulation frequency, e.g., shown as $f_1$. Demodulator 212 can accordingly operate to demodulate the reference frequency VREF and at the same time place the attenuated version of the main signal $V_{SIG}$ (corresponding to $B_{SIG}$) after having gone through the blocking capacitor, at the modulation frequency. Closed loop 210 can include amplifier 216 which have a desired gain (A), as shown.

Closed loop 210 may further include an analog filter 218, e.g., a notch filer. The filtering and demodulation can allow for or facilitate avoiding noise aliasing. Closed loop 210 may include a summation unit 220, which can be used to subtract a nominal reference signal (e.g., $V_{REFNOM}$) to adjust the reference signal $V_{REF}$ for producing a feedback (error) signal 210 used to adjust bias voltage supplied to xMR driver 204. The nominal reference voltage ($V_{REFNOM}$) may be set or adjusted as desired, e.g., in response to an external or internal operational condition or to meet a desired target or range of operation, etc. The summation unit 220 can provide the resulting signal 223 (feedback error signal) to a gain correction block 222, which may include gain adjustment/correction functionality. Closed loop 210 may include an optional integrator 221 as shown. Integrator 221 is not mandatory but may be advantageous since it can provide or facilitate higher loop gain and better stability conditions for the loop 210. The signal 225 produced by gain correction block 222 can be supplied to summation unit 226, which can be configured to subtract the feedback signal 225 from an initial bias signal 205 and supply the resulting adjusted bias signal 207 to the xMR driver 204 for driving and adjusting the sensitivity of xMR block 202, similar to as described above for sensor 100A of FIG. 1A.

Main signal path 230 may include amplifier 232, with indicated gain (B), and filter 234, e.g., a low-pass filter (LPF) or notch filter, configured to filter out (block) the reference signal component ($V_{REF}$) and to extract the main signal $V_{SIG}$ from the output 203 of xMR block 202. Main signal path 230 may optionally include one or more additional components, e.g., shown by amplifier 236, for additional processing and/or signal conditioning of main signal $V_{SIG}$. Main signal path 230 can produce one or more output signals 238 that are based on main signal $V_{REF}$ and which may be indicative of information encoded in the sensed magnetic field ($B_{SIG}$), e.g., corresponding to a current in a conductor or position of a moveable target/object.

FIG. 2B is a diagram showing an example self-calibrating magnetic field sensor 200B similar to the magnetic field sensor 200A of FIG. 2A but with a different configuration for feedback loop 210, in accordance with the present disclosure. In FIG. 2B like reference numbers are used to indicate features/components shared with magnetic field sensor 200A of FIG. 2A. As shown, magnetic field sensor 200B can include an xMR block 201, closed loop 210, main signal channel 230, and reference magnetic field section 240.

Sensor 200B is similar to sensor 200A of FIG. 2A but in feedback loop 210 sensor 200B includes a general filter 218 to indicate that any suitable filter (e.g., IIR or FIR), filter bank, or combination of filters with other elements (e.g., resistors, capacitors, and/or inductors) may be utilized. Similarly, instead of a gain correction unit, closed loop 210 includes amplifier 228, which may have any desired gain C.

Figure 3:
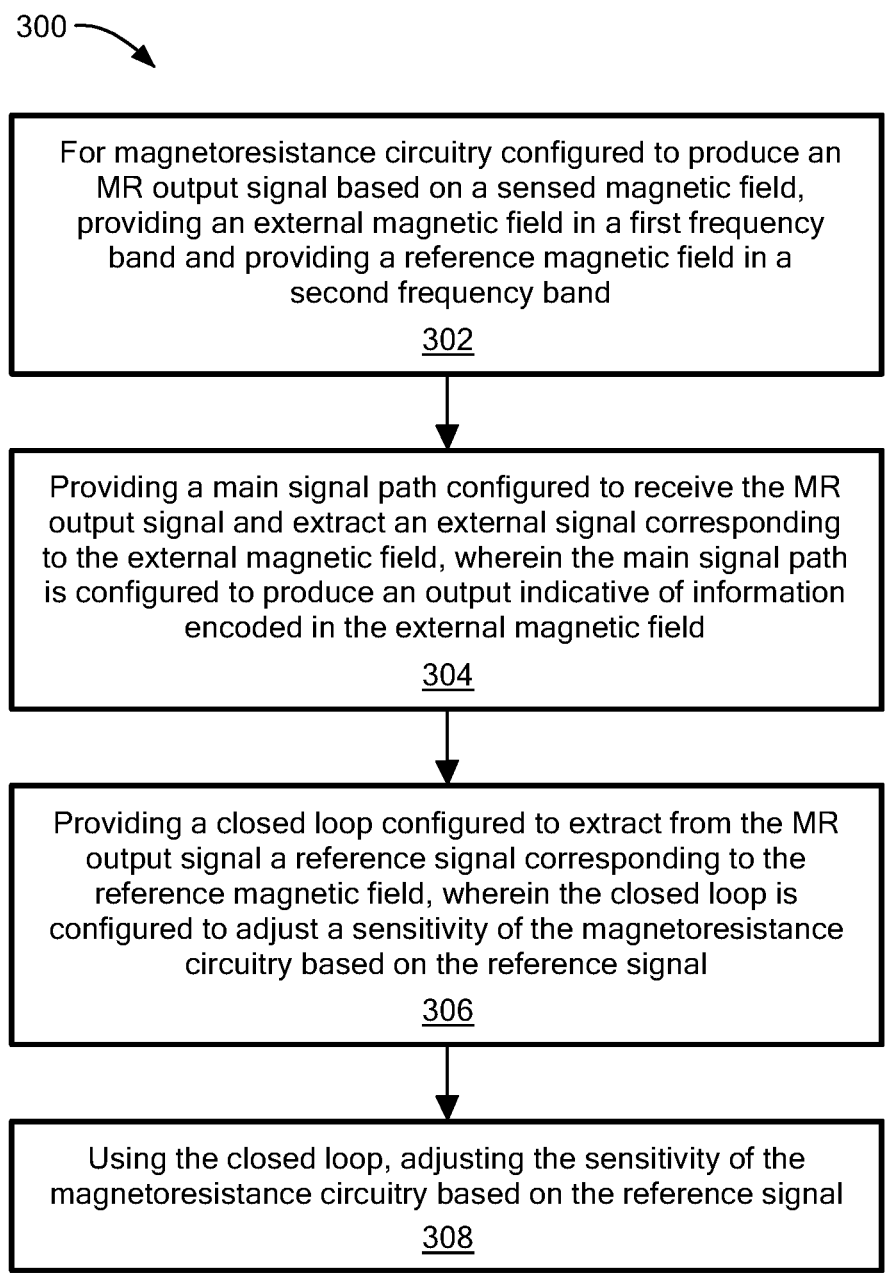
FIG. 3 is a diagram showing an example method of providing self-calibration for a magnetoresistance-based magnetic field sensor, in accordance with the present disclosure.

FIG. 3 is a diagram showing an example method 300 of providing self-calibration for a magnetoresistance-based magnetic field sensor, in accordance with the present disclosure. Method 300 can include, for magnetoresistance circuitry configured to produce an MR output signal based on a sensed magnetic field, providing an external magnetic field in a first frequency band and providing a reference magnetic field in a second frequency band, as described at 302. Method 300 can include providing a main signal path configured to receive the MR output signal and extract an external signal corresponding to the external magnetic field, wherein the main signal path is configured to produce an output indicative of information encoded in the external magnetic field. Method 300 can include providing a closed loop configured to extract from the MR output signal a reference signal corresponding to the reference magnetic field, wherein the closed loop is configured to adjust a sensitivity of the magnetoresistance circuitry based on the reference signal, as described at 306. Method 300 can include, by using the closed loop, adjusting the sensitivity of the magnetoresistance circuitry based on the reference signal, as described at 308. Method 300 can include other or alternate steps in other examples.

Figure 4A:
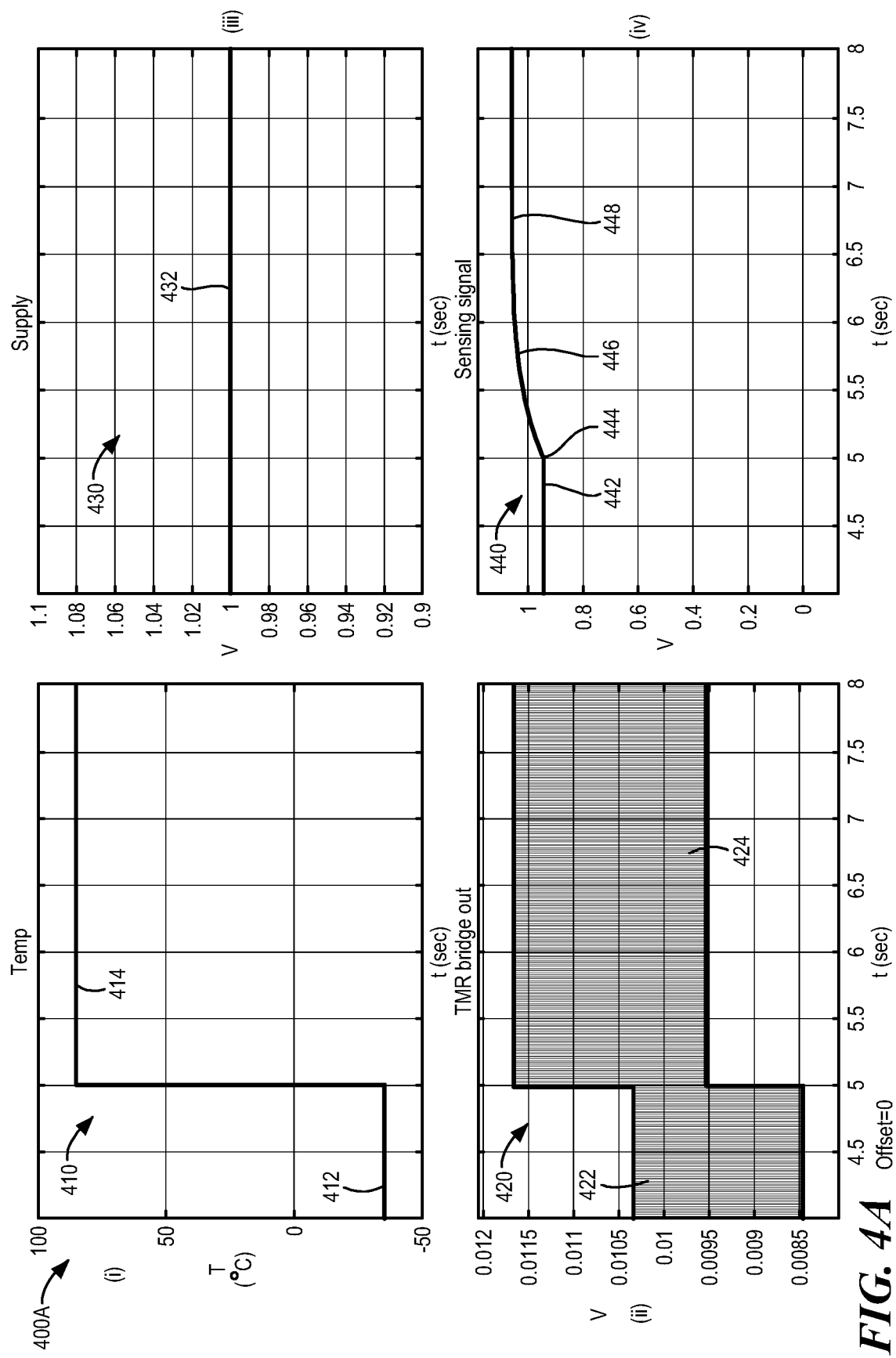
FIG. 4A is a set of graphs showing operational conditions for an example self-calibrating magnetic field sensor with MR bridge circuit and calibration loop, in accordance with the present disclosure, producing an output sensed-field signal while the calibration loop is in an inactive state.

FIG. 4A is a set 400A of graphs (i)-(iv) showing operational conditions for an example an example self-calibrating magnetic field sensor with MR bridge circuit (e.g., similar to as shown in FIG. 1A) and calibration loop, in accordance with the present disclosure, producing a sensed-field signal while the calibration loop is in an inactive state. Graph (i) shows a plot 410 of ambient temperature around the MR bridge vs. time and includes a step change, which is exaggerated to more show the effects on MR sensor sensitivity and the consequent closed loop compensation. Graph (ii) shows a plot 420 of voltage output of the MR bridge vs. time. Graph (iii) shows a plot 430 of bias voltage applied to the MR bridge vs. time. Graph (iv) shows a plot 440 of sensed-field output signal produced by the sensor vs. time. All four graphs extend over a common time span (t=4.0 s to 8.0 s). For the time span shown, the MR bridge circuit is subject to a constant applied (sensed) magnetic field ($B_{SIG}$). The expected corresponding output voltage from the bridge (10 mv) is indicated in (ii).

As shown in graphs (i)-(ii), a sudden increase in ambient temperature, shown as temperature 412 increasing by a step change to temperature 414, causes an increase in sensitivity of the MR elements in the MR bridge circuit, which correspondingly produces an increase in output voltage of the MR bridge circuit from the expected 10 mv (for this example) 422 to a higher value 424 (11 mv in this example). In addition, the signal associated with the internal generated field at f1 changes its amplitude due to the XMR sensitivity change. With a constant bias voltage applied to the MR bridge, shown in graph (iii), and the calibration loop in inactive or off state, the sensor output signal (indicating sensed field) exhibits a temperature-induced increase, as shown in graph (iv) by an initial value 442 changing (starting at 444) to a higher value 448 after increasing during a transition period 446, despite the applied xMR bias voltage remaining constant as shown in graph (iii); values 442 and 446 correspond to steady-state conditions before and after the change in temperature indicated in graph (i).

Figure 4B:
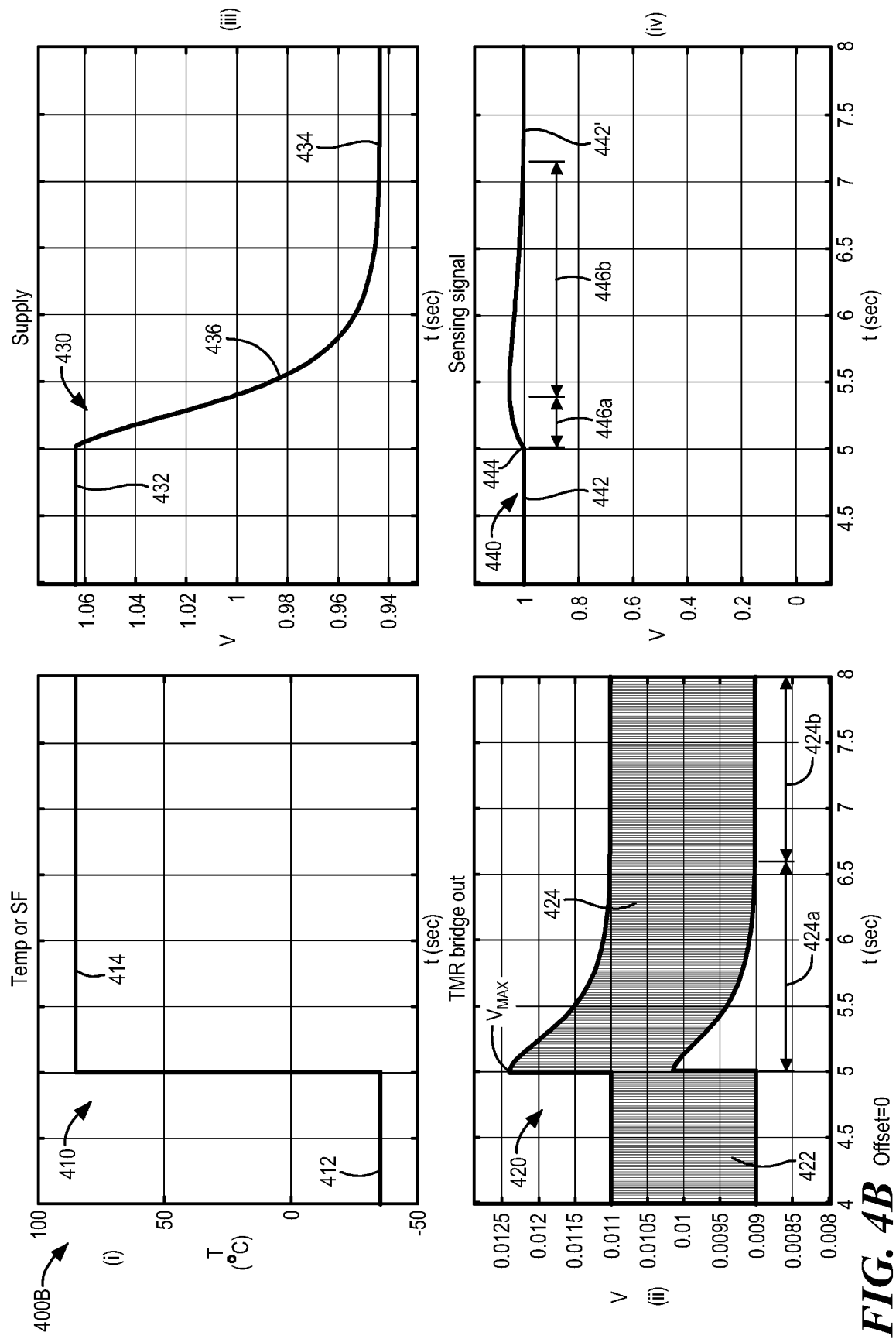
FIG. 4B is a set of graphs showing operational conditions for the example self-calibrating magnetic field sensor of FIG. 4A with the calibration loop in an active state, calibrating the sensor in response to external conditions.

FIG. 4B is a set 400B of graphs (i)-(iv) showing conditions for the example self-calibrating magnetic field sensor of FIG. 4A, producing a sensed-field field signal with the calibration loop in an active state, calibrating the sensor in response to external conditions. In FIG. 4B, graph (i) shows ambient temperature around the MR bridge, graph (ii) shows voltage output of the MR bridge, graph (iii) shows bias voltage applied to the MR bridge, and graph (iv) shows sensed-field output signal produced by the sensor, respectively, over a common time span (t=4.0 s to 8.0 s). For the time span shown, the MR bridge circuit is subject to a constant applied (sensed) magnetic field ($B_{SIG}$).

In FIG. 4B, graph (i) shows the sudden increase in ambient temperature, from temperature 412 to temperature 424, as shown for FIG. 4B. Graph (ii) shows the corresponding increase in MR sensitivity (of the MR elements in the sensor MR bridge circuit) initially producing an increase in output voltage of the MR bridge circuit (shown by $V_{MAX}$), similar to as shown in FIG. 4A. As further shown in graph (ii), however, after the time of the temperature change, the MR bridge output voltage 422 undergoes a correction (calibration) and returns to the initial value 422b after a transition period 422a. With the sensor closed loop (e.g., calibration or feedback loop 110 in FIG. 1A) in the active state, the loop operates to lower the bias voltage applied to the MR bridge, as shown in graph (iii). As a result, the applied bias voltage 430 is lowered from an initial higher value, before the temperature change in (i), to a final lower value 434 after moving through a transition 436. The adjustment of the bias voltage, shown in graph (iii), compensates for the rise in temperature, as shown in graph (iv), where the sensor output signal 440 (indicating sensed field) changes from an initial value 442 (10 mv in this example) to a temperature-induced value $V_{MAX}$ after the temperature change in graph (i) but then is adjusted (via the sensor's self-calibration) returning to the initial output value 442' corresponding to the constant applied magnetic field, after a transient period (t=5.0 s to ~7.0 s). An initial portion of the transient period 446a resembles the temperature-induced change shown in graph (iv) of FIG. 4A. The self-calibration function provided by the sensor closed loop is shown by later portion 446b.

In FIGS. 4A-4B, the horizontal (X) axes are shown in seconds (S) and are not necessarily a reference of what typically may be implemented. Examples of some realistic settling times for a feedback (closed) loop in accordance with the present disclosure can range from (but are not limited to) tens of micro-seconds to a few milliseconds. In addition, while a temperature step is shown for purposes of explanation, those of ordinary skill in the art will understand that a delta-temperature will typically occur over a (short) time span. The temperature step change shown is for illustrative purposes to indicate the loop compensating action. Furthermore, it will be understood, that if the indicated step function represented sudden application of a stray magnetic field, the Y axis would indicate field strength (e.g., Gauss) instead of temperature (degrees C.).

As explained previously, in example embodiments, the external magnetic field ($B_{SIG}$) and the internally-generated reference magnetic field ($B_{REF}$) simultaneously generate respective differential outputs on the MR bridge of the MR block/transducer, e.g., MR block 102 of FIG. 1A. To accommodate this and avoid mixing of the respective output signals produced by the MR bridge, the internally-generated reference magnetic field ($B_{REF}$) is generated/modulated at a frequency band that is separate or different from that of the external magnetic field ($B_{SIG}$), which is typically (but not necessarily) at base band.

Figure 5A:
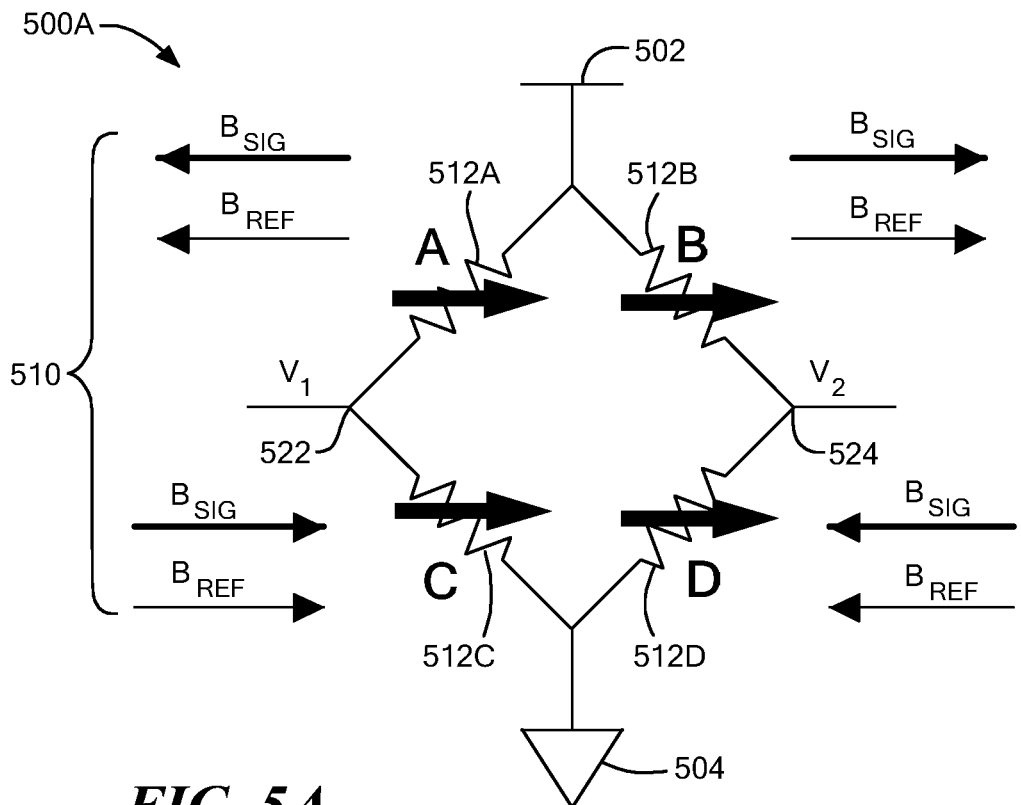
FIGS. 5A-5B are diagrams showing example MR bridge configurations with different directions of sensitivity for some of the included MR elements, in accordance with the present disclosure.
Figure 5B:
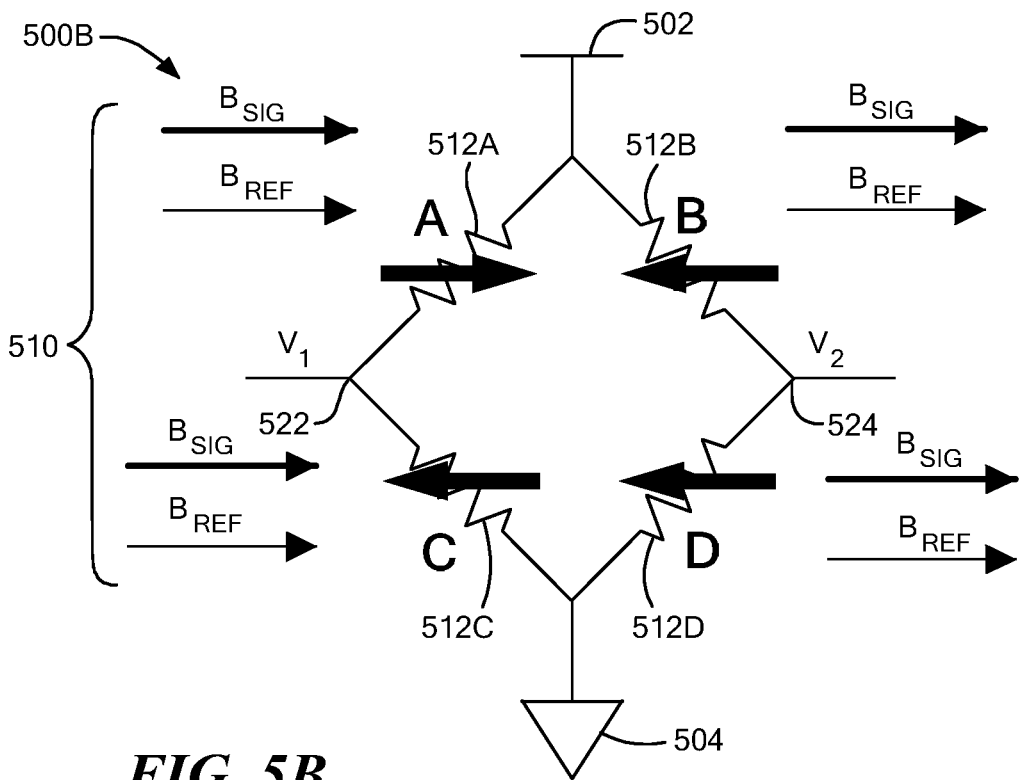

FIGS. 5A-5B are diagrams showing MR bridge configurations 500A-B with different directions of sensitivity for some of the included MR elements, in accordance with the present disclosure. In each diagram, MR block 500 includes a bridge 510 of MR elements 512A-D with a drive input connection 502, e.g., for a drive signal applied by a xMR driver, and a ground connection 504. The external magnetic field ($B_{SIG}$) and internally-generated reference magnetic field ($B_{REF}$) are indicated. The larger arrows (lying across bridge MR elements 512A-D) indicate the direction of sensitivity of the MR elements 512A-D. Differential output voltages (indicated as $V_1$ and $V_2$) are produced at locations 522, 524 the external magnetic field and the internally-generated magnetic field at the respective frequency bands of those magnetic fields.

FIG. 5A shows a first configuration 500A of MR bridge 500 with the bridge MR elements 512A-D sharing a common direction of sensitivity (uniform direction of larger arrows) while FIG. 5B shows a second configuration with a pair of re-pinned MR elements having opposed directions of sensitivity (opposed larger arrows shown for MR elements 512A-B). For some applications, re-pinning two of the MR elements opposite to the other pair of MR elements can allow for or facilitate sensing uniform external fields. In such a case the reference field would preferably also be uniform (see FIG. 5B).

Figure 6:
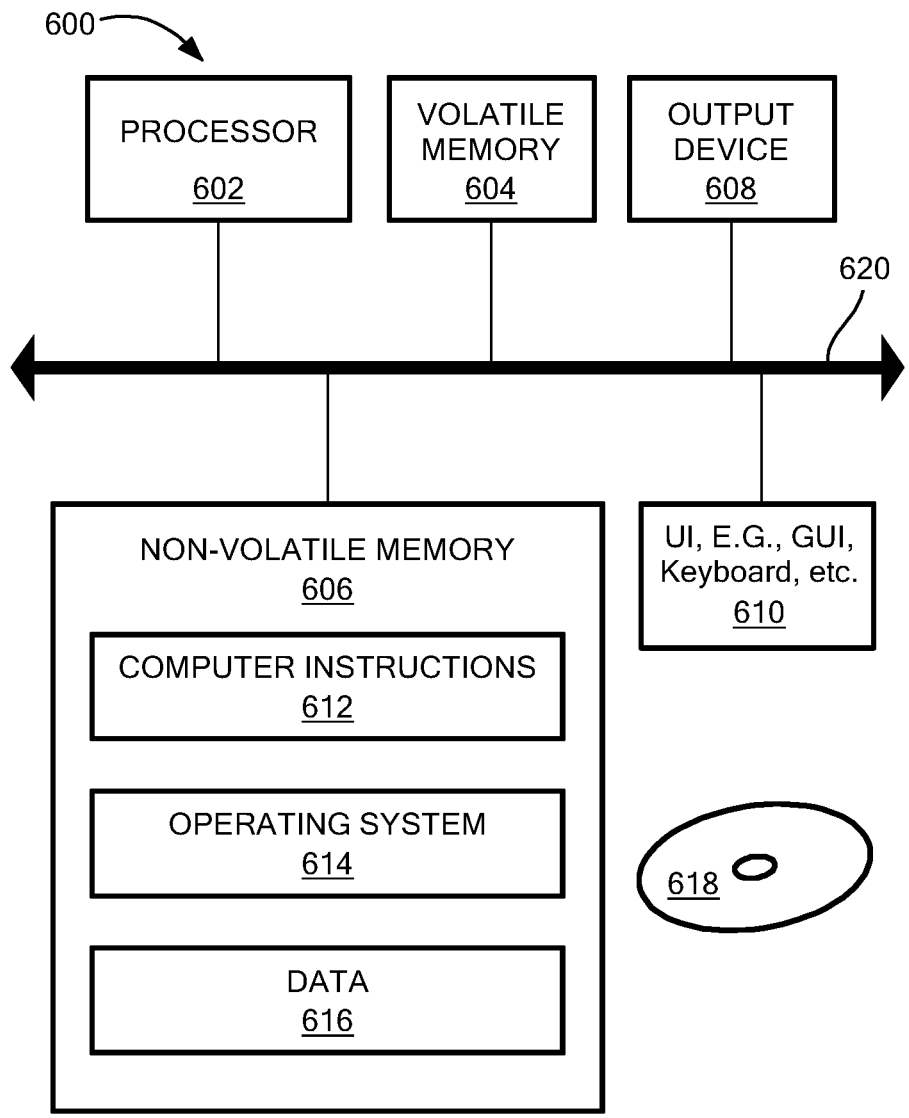
FIG. 6 is a block diagram of an example computer system operative to perform processing, in accordance with the present disclosure.

FIG. 6 is a block diagram of an example computer system 600 operative to perform processing, in accordance with the present disclosure. Computer system 600 can perform all or at least a portion of the processing, e.g., steps in the algorithms and methods, described herein. The computer system 600 includes a processor 602, a volatile memory 604, a non-volatile memory 606 (e.g., hard disk), an output device 608 and a user input or interface (UI) 610, e.g., graphical user interface (GUI), a mouse, a keyboard, a display, and/or any common user interface, etc. The non-volatile memory (non-transitory storage medium) 606 stores computer instructions 612 (a.k.a., machine-readable instructions or computer-readable instructions) such as software (computer program product), an operating system 614 and data 616. In some examples/embodiments, the computer instructions 612 can be executed by the processor 602 out of (from) volatile memory 604. In some examples/embodiments, an article 618 (e.g., a storage device or medium such as a hard disk, an optical disc, magnetic storage tape, optical storage tape, flash drive, etc.) includes or stores the non-transitory computer-readable instructions. Bus 620 is also shown.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 600 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. The programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit). In some examples, digital logic circuitry, e.g., one or more FPGAs, can be operative as a processor as described herein.

Accordingly, embodiments of the inventive subject matter can afford various benefits relative to prior art techniques. For example, embodiments and examples of the present disclosure can enable or facilitate e.g., systems and components achieving or obtaining an Application Safety Integration Level (ASIL) in accordance with a safety standard such as ISO 26262.

Various embodiments of the concepts, systems, devices, structures, and techniques sought to be protected are described above with reference to the related drawings. Alternative embodiments can be devised without departing from the scope of the concepts, systems, devices, structures, and techniques described.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal," "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" maybe used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" maybe used to refer to values that are within ±20% of one another in some embodiments, within ±10% of one another in some embodiments, within ±5% of one another in some embodiments, and yet within ±2% of one another in some embodiments.

The term "substantially" maybe used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A self-calibrating magnetic field sensor comprising:
    magnetoresistance (MR) circuitry configured to receive an external magnetic field in a first frequency band and a reference magnetic field in a second frequency band, wherein the magnetoresistance circuitry is configured to produce an MR output electrical signal including an external signal based on the external magnetic field and a reference signal based on the reference magnetic field;
    a coil driver circuit configured to produce the reference magnetic field and direct it to the magnetoresistance circuitry;
    a feedback loop configured to receive the MR output electrical signal from the magnetoresistance circuitry, wherein the feedback loop is configured to filter out the external signal and extract the reference signal, and wherein the feedback loop is further configured to adjust a sensitivity of the magnetoresistance circuitry based on the reference signal; and
    a main signal path configured to receive the MR output electrical signal and filter out the reference signal and extract the external signal, wherein the main signal path is configured to produce, based on the external signal, a main signal path output signal indicative of information encoded in the external magnetic field,
    wherein the feedback loop comprises a demodulator configured to demodulate the MR output signal at a modulation frequency of the reference magnetic field and produce a corresponding demodulated signal, and
    wherein the feedback loop comprises a first sum unit configured to subtract a nominal reference voltage from the demodulated signal and produce a feedback error signal.

2. The sensor of claim 1, wherein the magnetoresistance circuitry comprises a plurality of magnetoresistance elements configured in a bridge.

3. The sensor of claim 1, wherein the magnetoresistance circuitry comprises one or more giant magnetoresistance (GMR) elements.

4. The sensor of claim 1, wherein the magnetoresistance circuitry comprises one or more anisotropic magnetoresistance (AMR) elements.

5. The sensor of claim 1, where the magnetoresistance circuitry comprises one or more tunneling magnetoresistance (TMR) elements.

6. The sensor of claim 1, wherein the feedback loop further comprises a gain correction unit configured to receive the feedback error signal and based on the feedback error signal adjust the sensitivity of the magnetoresistance circuitry.

7. The sensor of claim 6, wherein the feedback loop further comprises a second sum unit configured to subtract the feedback error signal from a bias voltage supplied to an MR driver of the magnetoresistance circuitry.

8. The sensor of claim 6, wherein the gain correction unit comprises a third amplifier.

9. The sensor of claim 1, wherein the feedback loop comprises a first amplifier configured to provide a desired gain to the demodulated signal.

10. The sensor of claim 1, wherein the feedback loop further comprises a low-pass filter configured to receive the demodulated signal and remove residual signal components of the external signal.

11. The sensor of claim 10, wherein the low-pass filter comprises a digital filter.

12. The sensor of claim 11, wherein the digital filter comprises a cascaded integrator-comb (CIC) filter.

13. The sensor of claim 10, wherein the filter comprises an analog filter.

14. The sensor of claim 13, wherein the analog filter comprises a notch filter.

15. The sensor of claim 1, wherein the main signal path output signal comprises positional information about a target.

16. The sensor of claim 1, wherein the main signal path output signal comprises information about a current in a conductor.

17. A self-calibrating magnetic field sensor comprising:
magnetoresistance (MR) circuitry configured to receive an external magnetic field in a first frequency band and a reference magnetic field in a second frequency band, wherein the magnetoresistance circuitry is configured to produce an MR output electrical signal including an external signal based on the external magnetic field and a reference signal based on the reference magnetic field;
a coil driver circuit configured to produce the reference magnetic field and direct it to the magnetoresistance circuitry;
a feedback loop configured to receive the MR output electrical signal from the magnetoresistance circuitry, wherein the feedback loop is configured to filter out the external signal and extract the reference signal, and wherein the feedback loop is further configured to adjust a sensitivity of the magnetoresistance circuitry based on the reference signal; and
a main signal path configured to receive the MR output electrical signal and filter out the reference signal and extract the external signal, wherein the main signal path is configured to produce, based on the external signal, a main signal path output signal indicative of information encoded in the external magnetic field,
wherein the feedback loop comprises a demodulator configured to demodulate the MR output signal at a modulation frequency of the reference magnetic field and produce a corresponding demodulated signal, and
wherein the feedback loop comprises an analog-to-digital converter configured to convert the demodulated signal to a digital signal.

18. The sensor of claim 17, wherein the feedback path further comprises a digital integrator configured to receive the digital signal and output an integral of the digital signal over time.

19. The sensor of claim 17, wherein the magnetoresistance circuitry comprises a plurality of magnetoresistance elements configured in a bridge.

20. The sensor of claim 17, wherein the magnetoresistance circuitry comprises one or more giant magnetoresistance (GMR) elements.

21. The sensor of claim 17, wherein the magnetoresistance circuitry comprises one or more anisotropic magnetoresistance (AMR) elements.

22. The sensor of claim 17, where the magnetoresistance circuitry comprises one or more tunneling magnetoresistance (TMR) elements.

23. The sensor of claim 17, wherein the feedback loop further comprises a gain correction unit configured to receive the feedback error signal and based on the feedback error signal adjust the sensitivity of the magnetoresistance circuitry.

24. The sensor of claim 23, wherein the gain correction unit comprises a third amplifier.

25. The sensor of claim 17, wherein the feedback loop further comprises a second sum unit configured to subtract the feedback error signal from a bias voltage supplied to an MR driver of the magnetoresistance circuitry.

26. The sensor of claim 17, wherein the feedback loop comprises a first amplifier configured to provide a desired gain to the demodulated signal.

27. The sensor of claim 17, wherein the feedback loop further comprises a low-pass filter configured to receive the demodulated signal and remove residual signal components of the external signal.

28. The sensor of claim 27, wherein the filter comprises an analog filter.

29. The sensor of claim 28, wherein the analog filter comprises a notch filter.

30. The sensor of claim 17, wherein the low-pass filter comprises a digital filter.

31. The sensor of claim 30, wherein the digital filter comprises a cascaded integrator-comb (CIC) filter.

32. The sensor of claim 17, wherein the feedback path further comprises a digital integrator configured to receive the digital signal and output an integral of the digital signal over time.

33. The sensor of claim 17, wherein the main signal path output signal comprises positional information about a target.

34. The sensor of claim 17, wherein the main signal path output signal comprises information about a current in a conductor.

35. A self-calibrating magnetic field sensor comprising:
magnetoresistance (MR) circuitry configured to receive an external magnetic field in a first frequency band and a reference magnetic field in a second frequency band, wherein the magnetoresistance circuitry is configured to produce an MR output electrical signal including an external signal based on the external magnetic field and a reference signal based on the reference magnetic field;
a coil driver circuit configured to produce the reference magnetic field and direct it to the magnetoresistance circuitry;
a feedback loop configured to receive the MR output electrical signal from the magnetoresistance circuitry, wherein the feedback loop is configured to filter out the external signal and extract the reference signal, and wherein the feedback loop is further configured to adjust a sensitivity of the magnetoresistance circuitry based on the reference signal; and
a main signal path configured to receive the MR output electrical signal and filter out the reference signal and extract the external signal, wherein the main signal path is configured to produce, based on the external signal, a main signal path output signal indicative of information encoded in the external magnetic field,
wherein the feedback loop comprises a demodulator configured to demodulate the MR output signal at a modulation frequency of the reference magnetic field and produce a corresponding demodulated signal, and
wherein the feedback path further comprises an analog integrator configured to receive the demodulated signal and output an integral of the demodulated signal over time.

36. The sensor according to claim 35, wherein the magnetoresistance circuitry comprises a plurality of magnetoresistance elements configured in a bridge.

37. The sensor of claim 35, wherein the magnetoresistance circuitry comprises one or more giant magnetoresistance (GMR) elements.

38. The sensor of claim 35, wherein the magnetoresistance circuitry comprises one or more anisotropic magnetoresistance (AMR) elements.

39. The sensor of claim 35, where the magnetoresistance circuitry comprises one or more tunneling magnetoresistance (TMR) elements.

40. The sensor of claim 35, wherein the feedback loop further comprises a gain correction unit configured to receive the feedback error signal and based on the feedback error signal adjust the sensitivity of the magnetoresistance circuitry.

41. The sensor of claim 40, wherein the gain correction unit comprises a third amplifier.

42. The sensor of claim 35, wherein the feedback loop further comprises a second sum unit configured to subtract the feedback error signal from a bias voltage supplied to an MR driver of the magnetoresistance circuitry.

43. The sensor of claim 35, wherein the feedback loop comprises a first amplifier configured to provide a desired gain to the demodulated signal.

44. The sensor of claim 35, wherein the feedback loop further comprises a low-pass filter configured to receive the demodulated signal and remove residual signal components of the external signal.

45. The sensor of claim 44, wherein the filter comprises an analog filter.

46. The sensor of claim 45, wherein the analog filter comprises a notch filter.

47. The sensor of claim 35, wherein the low-pass filter comprises a digital filter.

48. The sensor of claim 47, wherein the digital filter comprises a cascaded integrator-comb (CIC) filter.

49. The sensor of claim 35, wherein the feedback path further comprises a digital integrator configured to receive the digital signal and output an integral of the digital signal over time.

50. The sensor of claim 35, wherein the main signal path output signal comprises positional information about a target.

51. The sensor of claim 35, wherein the main signal path output signal comprises information about a current in a conductor.

* * * * *

UNITED STATES PATENT AND TRADEMARK OFFICE
CERTIFICATE OF CORRECTION

PATENT NO. : 12,253,576 B2
APPLICATION NO. : 18/152189
DATED : March 18, 2025
INVENTOR(S) : Hernán D. Romero Page 1 of 1

It is certified that error appears in the above-identified patent and that said Letters Patent is hereby corrected as shown below:

In the Specification

Column 6, Line 43, delete "V down" and replace with --$V_{ref}$ down--.

Column 8, Line 57, delete "signal V" and replace with --signal $V_{ref}$--.

Column 10, Line 45, delete "field." and replace with --field, as described at 304.--.

Column 10, Line 56, delete "an example an example" and replace with --an example--.

Column 11, Line 1, delete "signal" and replace with --signals--.

Column 12, Line 48, delete "512A-B)." and replace with --512A-D).--.

In the Claims

Column 16, Line 35, Claim 5, delete "claim 1, where" and replace with --claim 1, wherein--.

Column 17, Line 51, Claim 22, delete "claim 17, where" and replace with --claim 17, wherein--.

Column 18, Line 65, Claim 39, delete "claim 35, where" and replace with --claim 35, wherein--.

Signed and Sealed this
Thirtieth Day of September, 2025

John A. Squires
*Director of the United States Patent and Trademark Office*